(12) United States Patent
Mouttet

(10) Patent No.: US 7,550,747 B2
(45) Date of Patent: Jun. 23, 2009

(54) PARALLEL ELECTRON BEAM LITHOGRAPHY STAMP (PEBLS)

(76) Inventor: Blaise Laurent Mouttet, 6380 Michael Robert Dr., Springfield, VA (US) 22150

( * ) Notice: Subject to any disclaimer, the term of this patent is extended or adjusted under 35 U.S.C. 154(b) by 584 days.

(21) Appl. No.: 11/395,238

(22) Filed: Apr. 3, 2006

(65) Prior Publication Data

US 2007/0228296 A1    Oct. 4, 2007

(51) Int. Cl.
*B05D 1/04* (2006.01)
(52) U.S. Cl. ........... 250/492.2; 250/492.1; 250/492.22; 250/492.3; 250/491.1; 430/296; 430/942; 427/458; 977/939; 977/947; 977/953; 850/62
(58) Field of Classification Search ............ 250/492.2, 250/492.22, 492.3, 491.1; 430/296, 942; 427/458; 977/939, 949
See application file for complete search history.

(56) References Cited

U.S. PATENT DOCUMENTS

| | | | |
|---|---|---|---|
| 4,896,044 A | 1/1990 | Li et al. | |
| 4,968,390 A | 11/1990 | Bard et al. | |
| 5,047,649 A | 9/1991 | Hodgson et al. | |
| 5,412,641 A | 5/1995 | Shinjo et al. | |
| 6,283,812 B1 | 9/2001 | Jin et al. | |
| 6,504,292 B1 | 1/2003 | Choi et al. | |
| 6,538,367 B1 * | 3/2003 | Choi et al. | 313/309 |
| 6,660,959 B2 | 12/2003 | Vallance et al. | |
| 6,794,666 B2 | 9/2004 | Choi et al. | |
| 6,899,854 B2 | 5/2005 | Darty | |
| 6,962,515 B2 | 11/2005 | Dean et al. | |
| 7,011,927 B2 * | 3/2006 | Iwamatsu | 430/296 |
| 7,012,266 B2 | 3/2006 | Jin | |
| 2002/0182542 A1 * | 12/2002 | Choi et al. | 430/296 |
| 2003/0102444 A1 * | 6/2003 | Deppert et al. | 250/492.22 |
| 2004/0036398 A1 * | 2/2004 | Jin | 313/309 |

OTHER PUBLICATIONS

Mesquida et al., Maskless nanofabrication using the electrostatic attachment of gold particles to electrically patterned surfaces, Microelectronics Engineering, 2002, 671-674.

Lim et al., Electrostatically Driven Dip-Pen Nanolithography of Conducting Polymers, Advanced Materials, Adv. Materials, 2002, 1474-1477.

Derakhshandeh et al., Fabrication of 100 nm gate length MOSFET's using a novel carbon nanotube-based nano-lithography, Materials Science and Engineering B, 2005, 354-358.

(Continued)

*Primary Examiner*—Jack I Berman
*Assistant Examiner*—Hanway Chang

(57) ABSTRACT

An array of vertically aligned electron emitting nanotips such as multiwall carbon nanotubes are formed and patterned for use as a lithographic stamp. The spacing and/or arrangement of the nanotips correspond to a predetermined pattern that is desired to be formed on an opposing substrate. Simultaneous actuation of the nanotips by a common electrode forms a pattern on the opposing substrate without any necessary scanning techniques or use of masks. Applying a sufficient electrical potential between the array and the substrate generates electron emission from the tips so as to cure a resist, produce localized electrochemical reactions, establish localized electrostatic charge distributions or perform other desirable coating or etching process steps so as to create nanoelectronic circuitry or to facilitate molecular or nanoscale processing.

19 Claims, 14 Drawing Sheets

OTHER PUBLICATIONS

Wen et al., Growth and characterization of aligned carbon nanotubes from patterned nickel nanodots and uniform thin films, J.Mater.Res., 2001, 3246-3253.

Jeong et al., Fabrication of the aligned and patterned carbon nanotube field emitters using the anodic aluminum oxide nano-template on a Si wafer, Synthetic Metals, 2003, 385-390.

Kim et al., Growth of carbon nanotubes with anodic aluminum oxide formed on the catalytic metal-coated Si substrate, Diamond and Related Materials, 2003, 870-873.

Akita et al., Length Adjustment of Carbon Nanotube Probe by Electron Bombardment, Jpn. J. Appl. Phys., 2002, 4887-4889.

Suh et al., Study of the field-screening effect of highly ordered carbon nanotube arrays, Applied Physics Letters, 2002, 2392-2394.

* cited by examiner

PARALLEL ELECTRON BEAM LITHOGRAPHY STAMP (PEBLS)

FIELD OF THE INVENTION

The present invention pertains to a tool and method used to form nanostructures or nano-structural features and is applicable to the fields of electronic fabrication, material processing, chemical processing, and biological processing at nanometer dimensions.

BACKGROUND OF THE INVENTION

Small scale fabrication has been dominated over the past 40 years by lithography techniques that employ radiation in the form or visible or ultraviolet light. However, these techniques are limited by the wavelengths of the light used and fabrication below 100 nm is problematic. Electron and ion beam lithography are alternative techniques capable of providing finer resolution but which typically use a serial scanning process that limits the speed of production.

Two additional techniques that have received attention because of their ability to fabricate structures with nanometer resolutions are nanoimprint lithography and scanning probe lithography. These techniques are distinguishable from the typical optical and electron based lithography discussed above in that these tools are proximal in nature and either contact, or are separated by a nanoscopic gap from, the substrate undergoing processing.

Nanoimprint lithography employs a molded stamp structure with grooves formed therein so as to emboss, coat, or otherwise imprint a pattern on a target substrate. However, in repeated use, the stamp structure of the mold may be subject to erosion or soiling over time that can negatively impact the achievable resolution so that nanometer resolution patterning becomes impossible or inconsistent.

Scanning probe lithography techniques employ devices with ultrafine tips to etch, coat, or otherwise treat a substrate so as to generate nanometer resolution patterns. However, scanning probe lithography is also a serial process and is therefore too time consuming to be employed in large scale fabrication.

Chapter 9 of *Nanoelectronics and Information Technology* (Ed. Rainer Waser, WILEY-VCH, 2003, pgs. 223-247) provides further background details of modern lithography approaches.

The present invention provides a fabrication tool and method to achieve nanometer resolution features which is capable of parallel processing and which may be used repeatedly without significant deterioration or reduction in reliability over time.

SUMMARY OF INVENTION

The present invention provides a nanofabrication tool that combines the sub-micrometer resolution available from electron beam lithography with the parallel processing capability found in nanoimprint lithography by using a parallel electron beam lithography stamp (PEBLS) in which the electron beam sources are very close to the target substrate ($\leq 100$ microns). The nanofabrication tool of the present invention comprises an array of vertically oriented nanotips capable of electron emission. The nanotips are formed in a predetermined pattern by removing unwanted nanotips from a uniform array of nanotips or by controlling the initial placement of catalytic particles used in the formation of the nanotips resulting in electron emitting nanotips with a predetermined spacing and/or positioning. The predetermined pattern of nanotips is chosen so as to match the placement of nanoscopic features desired to be formed on an opposing substrate so as to create a stamp-like structure that may be used to transfer the predetermined pattern as a fabrication imprint on an opposing substrate upon electron emission from the nanotip pattern. As opposed to other electron lithography systems no scanning system or mask is needed and the electron emission from the nanotips may be generated by use of a single electrode connected to the pattern of nanotips.

A microfluidic supply system and alignment sensor system among other optional features are taught to complement the functionality of the nanofabrication tool of the present invention. Several embodiments are taught including an alternative direct contact PEBLS approach, using the PEBLS tool in curing a resist, performing localized electrochemical reactions with the PEBLS tool, establishing predetermined electrostatic charge distributions with the PEBLS tool, and coating or etching process steps using the PEBLS tool.

DETAILED DESCRIPTION OF THE INVENTION

I. Outline of Parallel Electron Beam Lithography Stamp (PEBLS)

Figure 1A:
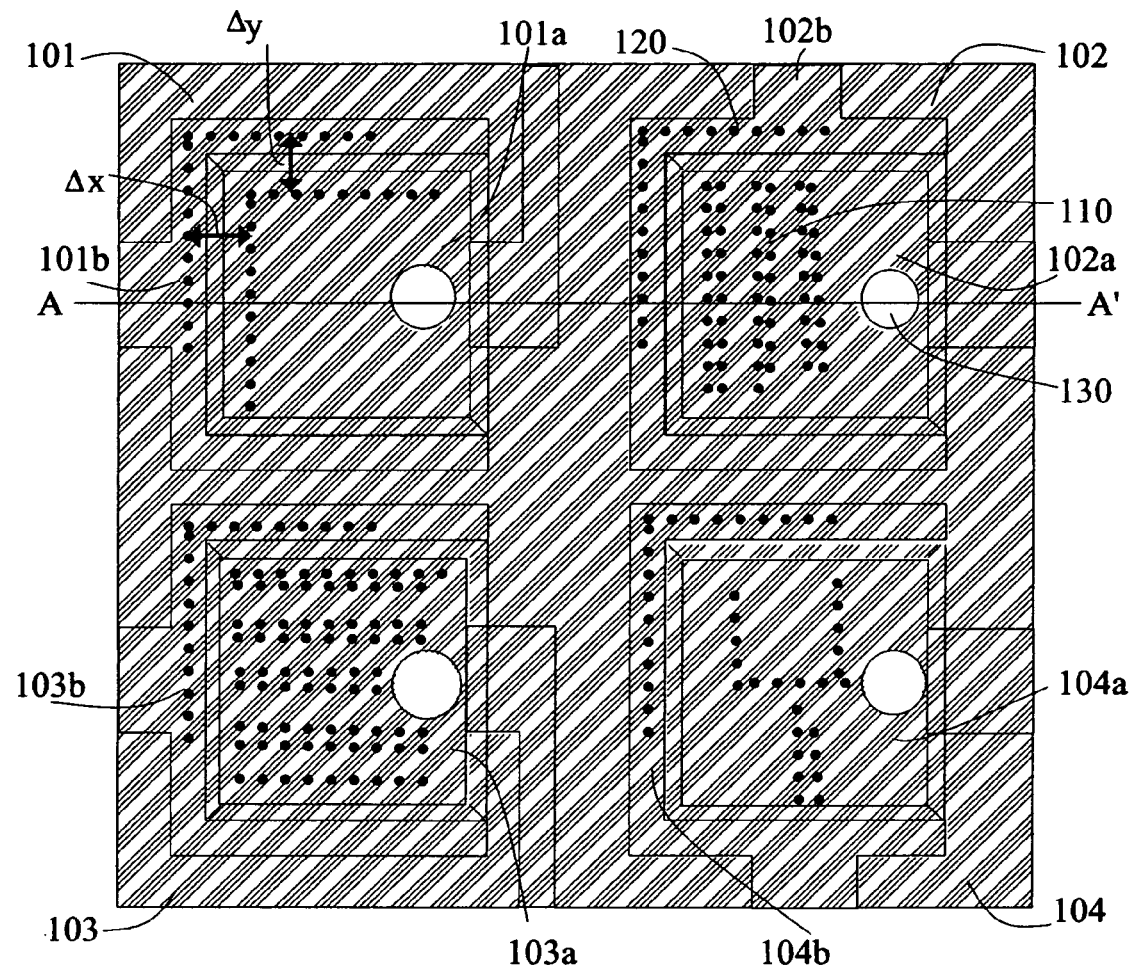
FIG. 1a illustrates a top view of one embodiment of the PEBLS tool of the present invention.
Figure 1B:
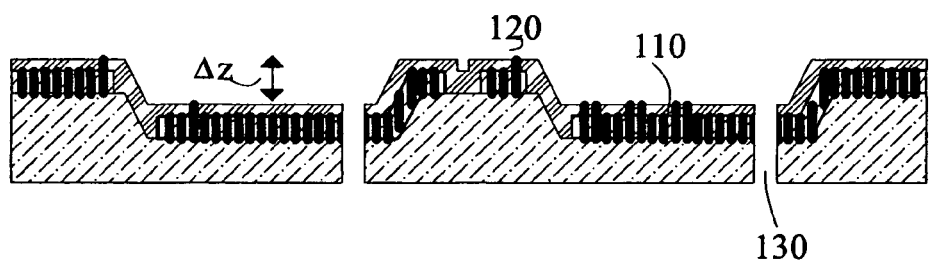
FIG. 1b illustrates a side view of FIG. 1a along line A-A'.

FIGS. 1a and 1b show the top and side view of one embodiment of the Parallel Electron Beam Lithography Stamp (PEBLS) system.

FIG. 1a illustrates four cells 101, 102, 103, 104, each of which include actuation electrodes 101a, 102a, 103a, 104a, with associated nanotip array patterns, and sensing electrodes 101b, 102b, 103b, 104b, with sensing nanotip patterns. Each cell size corresponds to the size of the area desired to be processed. For example, if the PEBLS is designed to pattern an area corresponding to microprocessor chip, cell sizes of 1 cm×1 cm may be appropriate. However, if the target of manufacture is a single circuit component such as an individual transistor, cell sizes in the micron range would be more appropriate. Multiple cells are provided each with an integrated alignment system 120 to achieve multiple process steps. However, if used for a single process step the alignment sensors 120 may be excluded and a common nanotip pattern may be assigned to each cell to achieve the same process step over a large array of different targets simultaneously. While a 2×2 cell geometry is shown for exemplary purposes larger cell arrays would obviously be useful to increase the number of possible patterns that may be formed or, alternatively, a single cell (1×1) or other cell geometries (1×2, 2×3, etc.) may be formed.

In the present embodiment cell 101 is designed as an alignment cell to imprint a pattern on an opposing substrate using the nanotip array pattern associated with electrode 101a. Each of the cells includes a nanotip alignment sensor arrangement 120 associated with electrodes 101b-104b. Operation of the alignment sensor is explained in more detail with respect to FIGS. 7a-7d. In brief, the nanotip array pattern associated with electrode 101a of cell 101 is used to form a corresponding alignment pattern on an opposing substrate. The alignment pattern formed may then be used as a reference for the sensing nanotips of the sensing electrodes 101b-104b. Provided that the displacements $\Delta x$, $\Delta y$ between the nanotip pattern associated with electrodes 101a-104a and 101b-104b is identical for each cell, nanotip patterns associated with each electrode 102a-104a may be successfully overlapped to form more complex patterns.

Cells 102-104 each contain a pattern of nanotips associated with actuation electrodes 101a-104a. Instead of using a scanning electron beam as in conventional electron beam lithography or a specialized mask as in projection electron beam lithography, the present invention maps an emitter tip to each point that is desired to be patterned. Advances in high density ordered arrays of nanotip electron emitters have been progressively applied in recent years to devices such as field emission displays. Arrays of vertically aligned multiwall carbon nanotubes have been successfully employed at densities above $10^{10}$ tubes/cm$^2$ with intertube spacing on the order of tens of nanometers. Thus the intertube nanotube spacing may be formed on the order of a desirable resolution for forming patterns useful for high density transistor array fabrication or other small scale fabrication procedures. Reference is made to chapter 8 of *Carbon Nanotubes: Science and Applications* (Ed. M. Meyyappan, CRC Press, 2005, pgs. 195-211) for basic background of the use of nanotubes as field emitters.

Cells 102 and 103 may employ patterns of parallel multiwall carbon nanotube emitters to form corresponding parallel lines on an opposing substrate by simultaneously actuating all of the nanotubes in a cell with the corresponding electrode of the cell. In case the desired resolution is smaller than the intertube spacing, additional cells may be provided with the associated nanotip arrays formed at offset distances from the reference sensing nanotubes 120. For example, during fabrication of the cells a second version of cell 102 with a corresponding lithographic nanotube array 110 may be fabricated but with an offset spacing of $\Delta x+h/2$, $\Delta y$ from the reference nanotips, where h is the spacing between nanotubes in the x-direction. Ideally the combined patterning using an overlap of the two cells could improve the pattern resolution in the x-direction so as to be half the intertube spacing h.

In FIG. 1b, the gap $\Delta z$ between the emission portion of the tips of the alignment sensor 120 and the emission portion of the nanotip array is illustrated. When placed in contact with an opposing substrate to be processed this distance determines the spacing between the lithography tip array 110 and the opposing substrate. Reference numeral 130 refers to a microfluidic channel for performing one of a variety of functions including: supplying liquid or gaseous fluids to facilitate the manufacturing processes to be performed by each cell, removing etched material from a processed substrate during electron beam etching, or otherwise regulating the environment before, during, or after nanofabrication procedures are performed. It is noted that environmental control (i.e. vacuum/pressure regulation, contamination, etc.) is a critical and expensive aspect of many conventional lithographic techniques. Employing integral encapsulated control over the environment within the PEBLS fabrication tool of the present invention is thus seen to provide the advantages of finer environmental and chemical supply regulation while reducing the amount of external environmental regulation necessary.

II. Manufacturing of PEBLS

FIGS. 2a-2g show a side view of a manufacturing method of the PEBLS of FIGS. 1a-1b. FIGS. 3a-3g shows a top view of the manufacturing method of the PEBLS corresponding to FIGS. 2a-2g.

Figure 2A:
FIGS. 2a-2g illustrates a side view of a manufacturing method of the PEBLS tool of FIGS. 1a-1b.
Figure 3A:
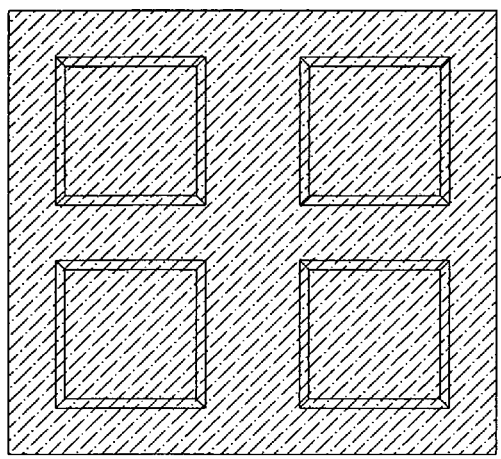
FIGS. 3a-3g illustrates a top view of the manufacturing method of the PEBLS tool corresponding to FIGS. 2a-2g.

Anisotropic etching of a <100> surface orientation Si substrate using $SiO_2$ as an etch mask may be performed to provide the substrate 1000 of FIGS. 2a and 3a.

Figure 2B:
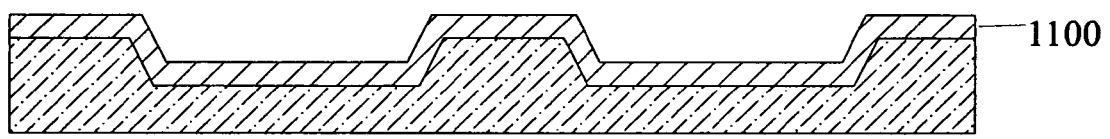
Figure 3B:
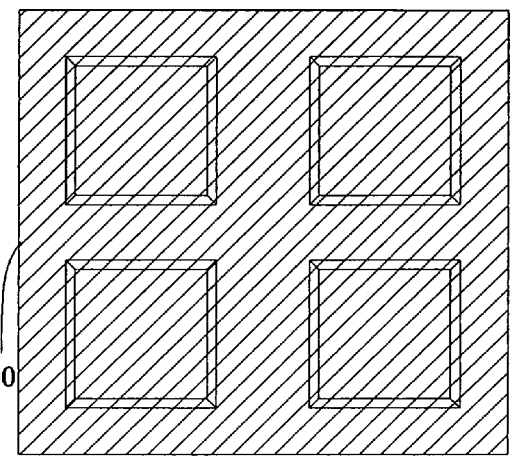

An anodic aluminum oxide (AAO) template 1100 may be formed on the substrate 1000 as shown in FIGS. 2b and 3b using known techniques such as disclosed by the articles of Kim et al. "Growth of carbon nanotubes with anodic aluminum oxide formed on the catalytic metal-coated Si substrate" (Diamond and Related Materials 12, 2003, 870-873) or Jeong et al. "Fabrication of the aligned and patterned carbon nanotube field emitters using the anodic aluminum oxide nanotemplate on a Si wafer" (Synthetic Metals 139, 2003, 385-390). AAO templates include vertically aligned nanopores and are formed with a thickness on the order of several microns with diameters and interpore spacing of the nanopores in the nanometer range. Thus arrays of highly ordered nanotubes may be formed extending from catalytic material at the bottom of the templates.

Figure 2C:
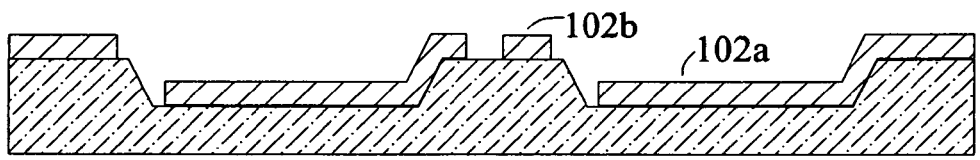
Figure 3C:
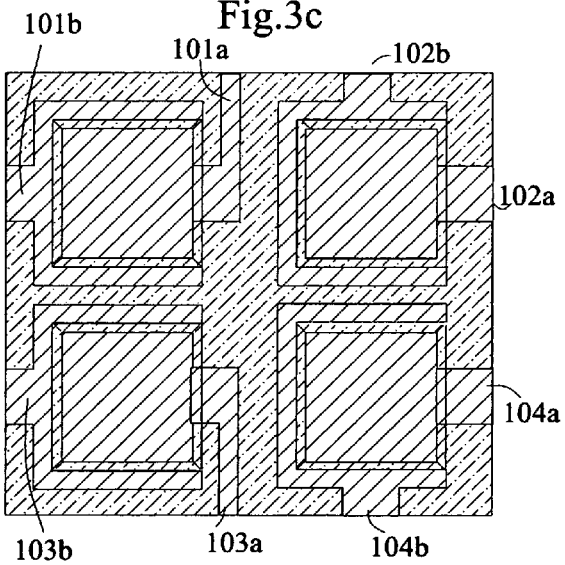

Etching away undesired portions of the AAO template 1100 produce patterned formations used as the actuation electrodes 101a-104a and sensing electrodes 101b-104b as shown in FIGS. 2c and 3c.

Figure 2D:
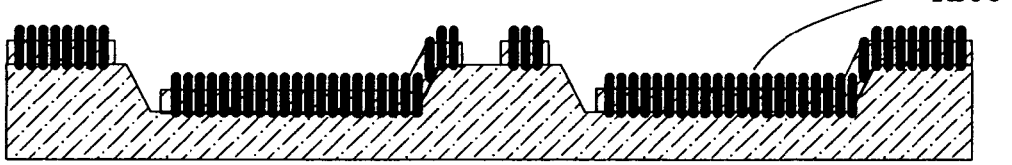
Figure 3D:
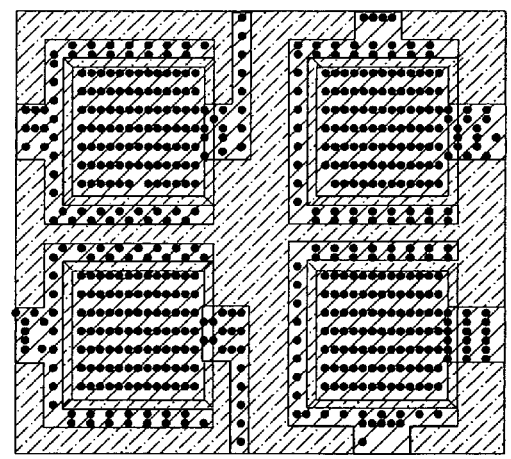

Growth of multiwall carbon nanotubes 1200 as taught by Kim et al. or Jeong et al. may then be performed resulting in the structure of FIGS. 2d and 3d. It is noted that the extension of the nanotubes above the AAO template 1100 in the drawings is exaggerated for exemplary purposes. Experimental evidence indicates optimum field emission from carbon nanotubes is achieved when spacing between individual nanotubes is equal to the nanotube extension above the AAO template as indicated by Suh et al. "Study of the field-screening effect of highly ordered carbon nanotube arrays" (Applied Physics Letters, Volume 80, No. 13, 2002, 2392-2394). Thus for intertube spacing in the order of tens of nanometers the nanotube height above the AAO template 1100 should also be of the order of tens of nanometers while the AAO thickness is on of the order of microns.

Figure 2E:
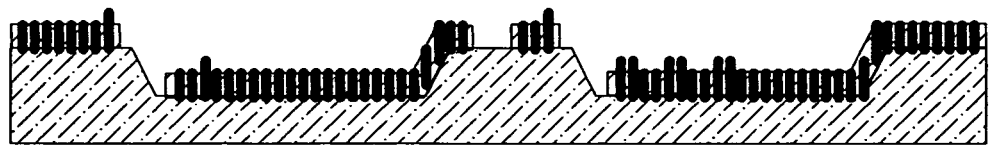
Figure 3E:
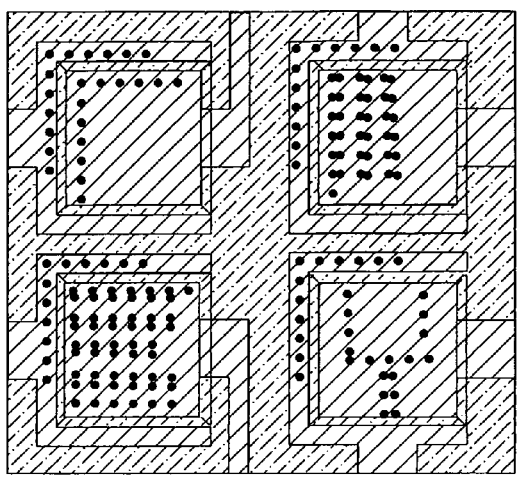

FIGS. 2e and 3e show the structure after patterning of the nanotube array. Removal of unwanted tips may be performed by a combination of course etching techniques using conventional optical lithography and fine etching using an electron beam or scanning probe microscope etch technique. Jin et al.

U.S. Pat. No. 6,283,812 proposes several nanotube tip shortening techniques so as to generate uniform height nanotubes by use of laser, electron, or ion beams, or by mechanical or chemical processing. Dean et al. U.S. Pat. No. 6,962,515 discloses selectively rendering unwanted carbon nanotubes nonconductive during the fabrication of a field emission display. The article "Length Adjustment of Carbon Nanotube Probe by Electron Bombardment" by Akita et al. (Jpn. J. Appl. Phys., vol. 41, 2002, 4887-4889) examined the use of an electron emitting nanotube to etch away the length of an opposing target nanotube which demonstrates a technique of individual nanotube etch regulation. Any of the above techniques are contemplated for use for the selective etching of the nanotubes on a group or individual basis. The selective removal of the nanotubes in the present invention is designed to result in arrays of nanotubes wherein the relative spacing between the vertical nanotubes match a predetermined fabrication pattern for nanoscale features analogous to a mask pattern used, for example, as a fabrication pattern for MOSFET transistor arrays.

Figure 2F:
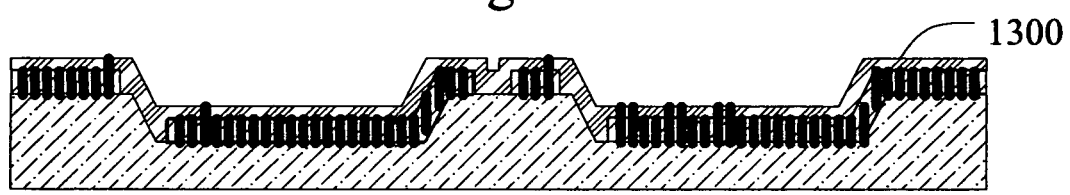
Figure 3F:
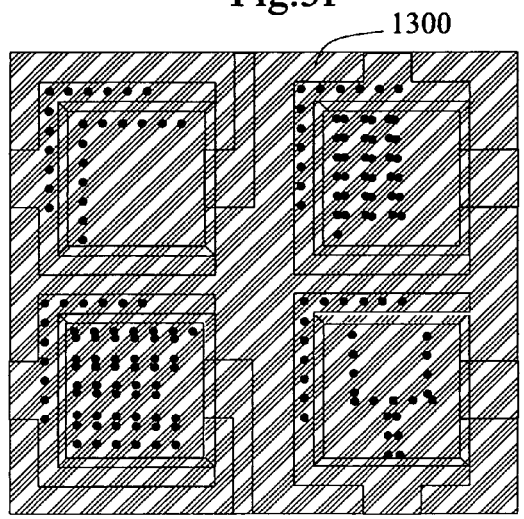

FIGS. 2f and 3f show the optional step of providing a passivation layer 1300 formed from an insulating material such as $TiO_2$ serving to protect the tips from environmental or chemical damage and from backscattered electrons. An additional metallic layer (not shown) may be added to serve as a gate contact layer for facilitating regulation of electron emission from the nanotips in the fashion disclosed in the article of Derakhshandeh et al. "Fabrication of 100 nm gate length MOSFET's using a novel carbon-nanotube based nano-lithography" (Materials Science and Engineering B, 124-125, 2005, 354-358). Various polishing techniques may be used to assure planarity of the passivation layer 1300 so that when contacting a target substrate to be processed by the PEBLS uniform contact occurs.

Figure 2G:
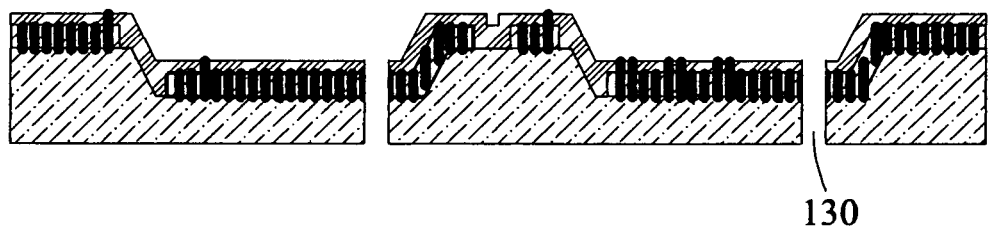
Figure 3G:
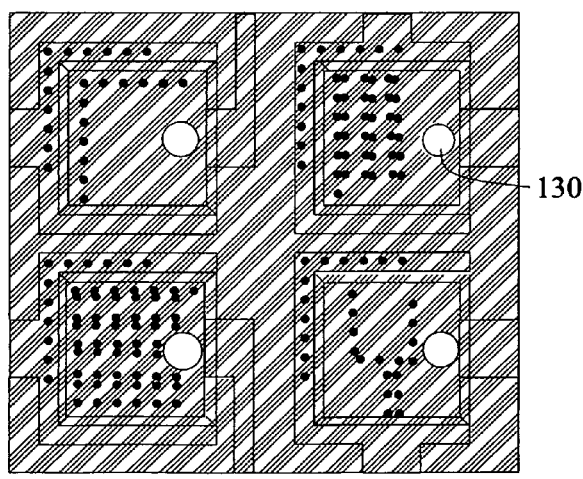

FIGS. 2g and 3g show the formation of microfluidic channel 130 associated with each cell formed via an appropriate vertical etch technique such as deep reactive ion etching or a laser driven technique performed on the top or bottom side of the PEBLS. Connecting the bottom surface of the PEBLS to an appropriate fluid source can provide material supply to the channels 130 to be used in fabrication. Alternately a cooling liquid may be supplied via the channel for temperature regulation, or the channel may provide for gas pressure regulation within the cavity formed between the PEBLS and the target substrate being processed, or a cleaning fluid may be supplied via the channel to remove unwanted debris from the cavity. Connecting the back side of the PEBLS to a microfluidic regulation system may allow for combining multiple of the above features in a single cell by switching microfluidic pathways between multiple fluid sources and particular channels 130. Valves, pumps, filters, mixers, and separators may be used in combination with the PEBLS system to provide a variety of fluid (liquid or gas) or molecular agents to the channels. Reference is made to chapter 9 of *Micromachined Transducers Sourcebook*, Kovacs, McGraw-Hill, 1998, pgs. 805-818, 823-855 for background on the types of microfluidic devices contemplated to be useful in combination with the PEBLS for distributing the fluid. It is noted that prior art teachings in the arts of inkjet printing and biological/chemical fluid processing are relevant to many common problems in microfluid supply issues and one of ordinary skill in the art may look to these areas for solutions in microfluidic supply. In an alternate embodiment, all of the cell channels 130 may be connected to a common source to achieve common regulation of vacuum, temperature, fluid supply, or other effects for all of the cells without use of microfluidic control.

The above description mentions several examples of materials which may be used to fabricate the PEBLS however the fabrication procedure is not limited to a particular material choice and several variations may be made such as using a glass or quartz substrate as a starting material. Also, while multiwall carbon nanotubes are used in the primary embodiment other materials may be used to form vertically aligned arrays of nanotips such as single walled carbon nanotubes, chalcogenide nanotubes, or conductive nanowires formed of doped Si, GaAs, ZnO, or GaN.

In addition, in order to enhance field emission from the nanotips a continuous conductive coating may be applied to the nanotips as taught in Choi et al. U.S. Pat. No. 6,504,292.

Figure 4A:
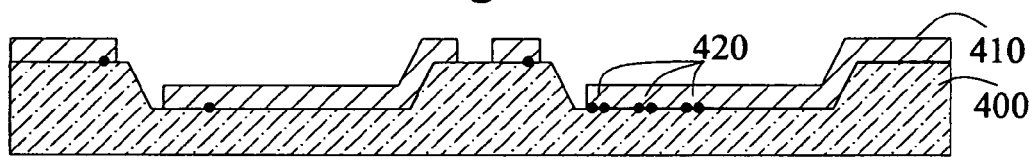
FIGS. 4a-4c illustrates an alternate embodiment of the manufacturing process of the PEBLS tool of the present invention.
Figure 4B:
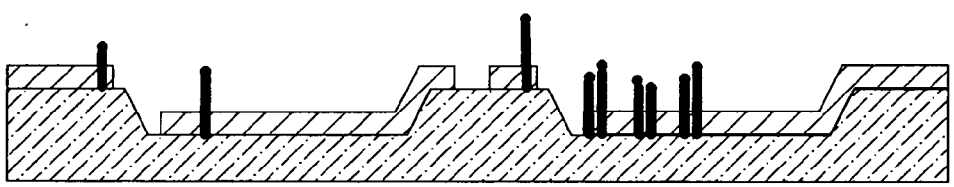
Figure 4C:
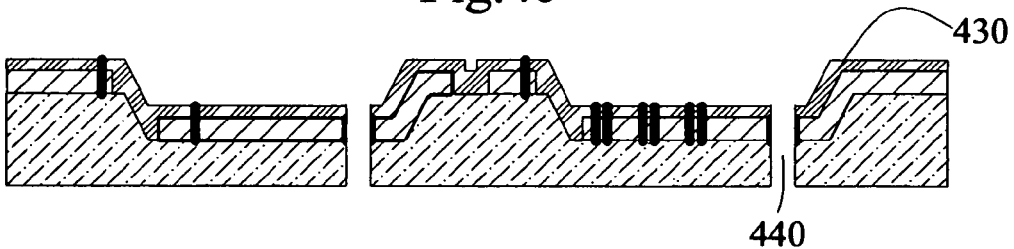

FIGS. 4a-4c show one alternate manufacturing technique in which, instead of nanotip removal, the proper positioning of nanotips in the PEBLS is generated by appropriate initial placement of the catalytic particles used in the nanotip growth. In FIG. 4a Si substrate 400 and template 410 are formed as explained previously with respect to FIG. 2c except that catalytic particles 420 have been selectively formed or placed within the template 410. An article by Wen et al., "Growth and characterization of aligned carbon nanotubes from patterned nickel nanodots and uniform thin films" (J. Mater. Res., vol. 16, no. 11, 2001) demonstrates this methodology for growing multiwall nanotubes from a Ni template in which Ni nanodots are selectively deposited. Growth of the nanotubes (FIG. 4b), followed by application of passivation layer 430, chemical polishing or the catalytic particle tips, and formation of microfluidic passages 440 results in the structure of FIG. 4c.

III. Contact PEBLS

FIGS. 2-3 disclose the fabrication of a PEBLS that includes a spatial cavity between the emission tips used in lithography and a target substrate to be processed by the PEBLS. When the sensor nanotips 120 contact the target substrate the distance between the target substrate and the lithography tips is set by $\Delta z$ (FIG. 1b) which may range from 1-100 microns. However, backscattered electrons and/or ions from the target substrate would lead to charge buildup within the cavity and therefore a direct contact approach may be more appropriate in some circumstances.

Figure 5:
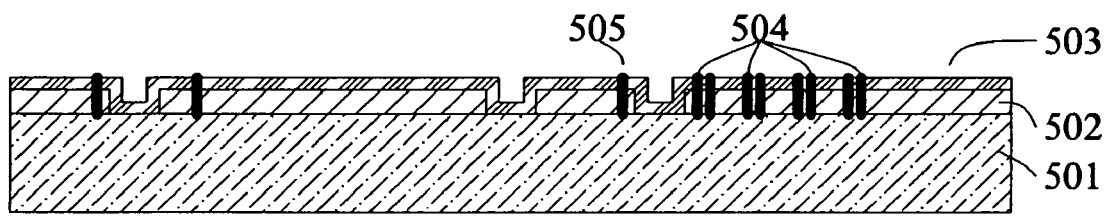
FIG. 5 and FIG. 6 illustrate alternate embodiments of the PEBLS tool of the present invention that may be used in direct contact with the substrate undergoing processing.
Figure 6:
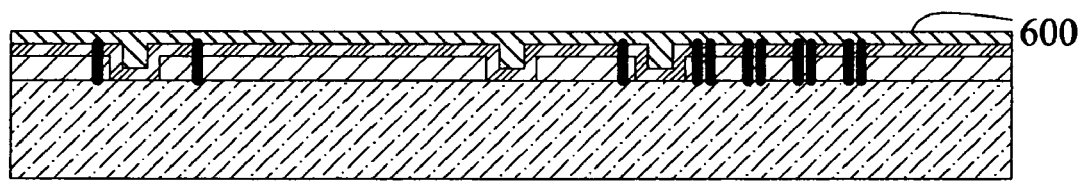

FIG. 5 shows a PEBLS designed where $\Delta z=0$ by excluding the manufacture step of creating different cells in FIG. 2a and instead performing the manufacture on a non-etched substrate 501 and forming electrode layer 502, passivation layer 503, nanotip lithographic array 504, and nanotip alignment sensor array 505 as previously described. Although removal of the cell structure provided in the non-contact embodiment eliminates the advantages of a fluid supply channel, precoating of the surface of the PEBLS with a desirable fluid or molecular species 600 intended to be coated on a target substrate, as shown in FIG. 6, may provide a mechanism for facilitating localized electrochemical bonding of the coating material to the target substrate based upon the nanotip positioning.

IV. Alignment Sensor Operation

FIG. 7a-7c and 8a-8c illustrate the operation of the alignment sensor 120. A substrate 700 to be processed by the PEBLS is initially patterned with a conductive electrode pattern 710 and with traces 720 leading to a control circuit (not shown). The target fabrication area on the substrate 700 formed by the electrode pattern 710 is indicated by numeral 730 in FIG. 8a and should be of a size substantially equal to that of a cell of the PEBLS which, for the purposes of the current example, may be of the order of 1 cm×1 cm. In this case the dimensions A and B of the electrode pattern 710 may be of the order of tens of micrometers.

Using a positioning stage with optical sensors or the equivalent providing sensed feedback, the electrode pattern 710 of the substrate 700 may be positioned approximately opposite the nanotips of the initial cell 101 (FIG. 1*a*) within a few microns tolerance. The nanotips of the initial cell are then actuated so as to etch away surface atoms from the electrode pattern creating patterns 810 and 820. The etched region created by each nanotip is indicated by references 740 in the magnified views of FIG. 8*b*-8*c* with x-axis width a and y-axis length b. Of course depending upon the time of voltage actuation the amount of electron etching may result in smaller etched regions per nanotip or a larger overlapping etch pattern formed by the combined nanotips electron emission. The positioning stage may then reposition the substrate 700 so that target area 730 is positioned within a few microns of the next cell. A subpositioning system (to be described in relation to FIG. 11) may then be used for nanometer positioning.

Figure 7A:
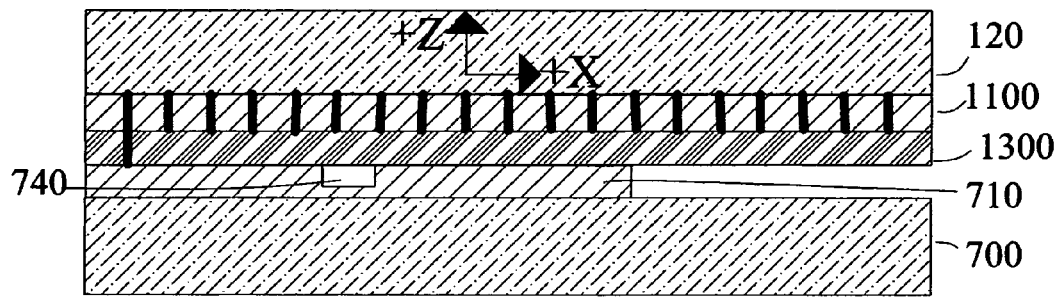
FIGS. 7a-7c illustrates the use of an alignment sensor in positioning the PEBLS tool.
Figure 7B:
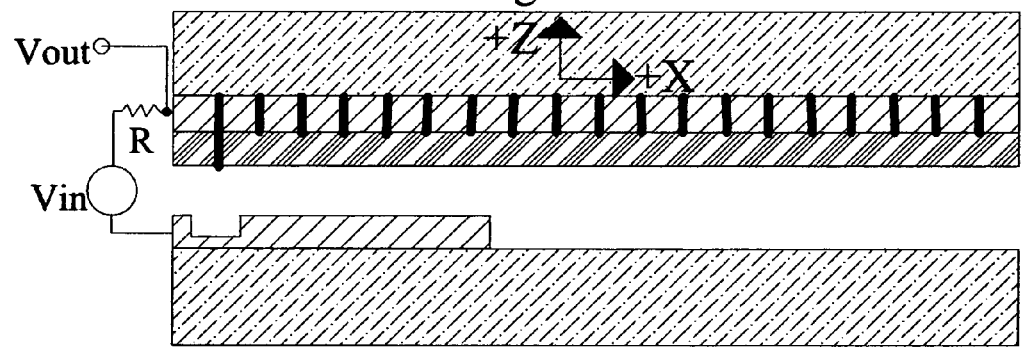
Figure 7C:
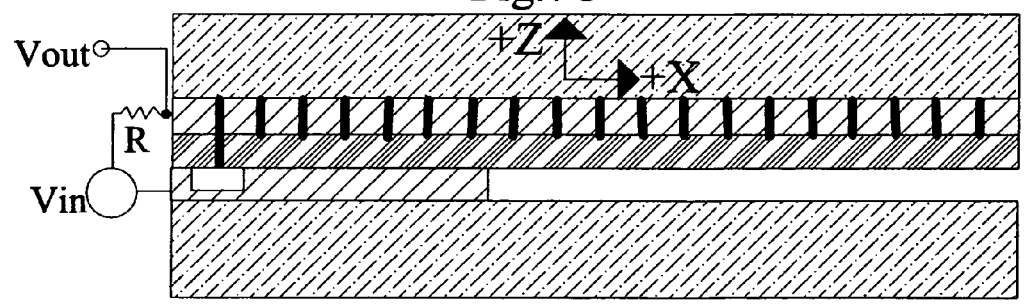
Figure 8A:
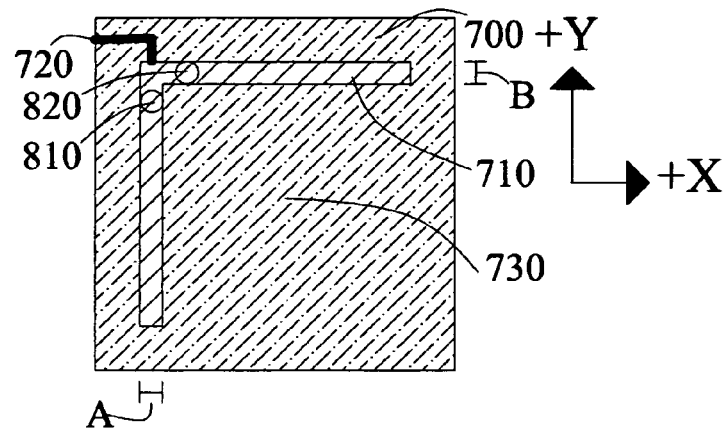
FIGS. 8a-8c illustrates alignment to a target pattern.
Figure 8B:
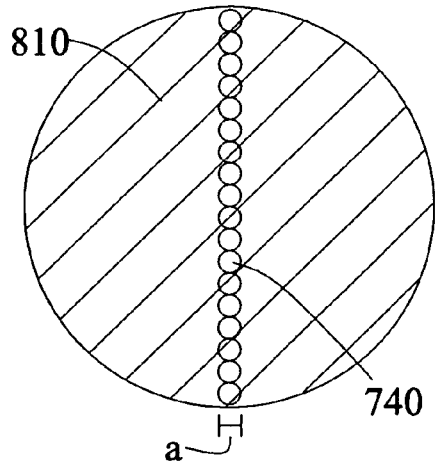
Figure 8C:
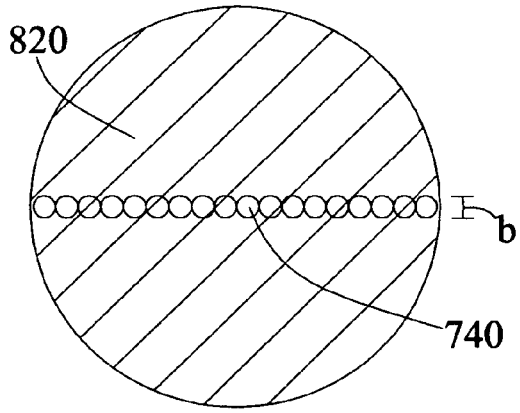

An example of the alignment provided by the subpositioning system is shown in FIG. 7*a*-7*c*. In FIG. 7*a*, the nanotips within the alignment sensor 120 provide a conductive path to the electrode pattern 710. Using the example of carbon nanotubes, resistances of the order of tens to hundreds of kohms have been measured for individual nanotubes with increased conductivity dependent upon tube diameter. In the current example, given a 100 nm spacing between nanotubes and if 100 nanotubes were used in the alignment sensor 120, 50 may be provided to each alignment axis along the length of 5 microns (longer sensor arrays may be provided but would require more laborious fabrication and would be subject to skew problems reducing reliability). If all of these nanotubes are in contact with the conductive electrode pattern 710 the measured resistance would (ideally) be $1/100^{th}$ of the average individual nanotube resistance. Given the voltage divider circuit of FIG. 7*b* and 7*c*, if R is set to the average nanotube resistance then if all 100 of the nanotubes in the alignment sensor 120 are in contact with the electrode pattern 710, Vout/Vin≅0.01. If (N/100)% of the nanotubes are in contact Vout/Vin=1/(N+1). For ideal alignment N=0 and Vout/Vin=1. Thus the alignment strategy of the current example uses a search for the maximum resistance between the alignment sensor's nanotubes and the electrode pattern 710. Starting from a minimum resistance state (FIG. 7*a*) achieved via the micrometer precision of the positioning stage a hopping scan algorithm may be initiated by which the PEBLS is retracted in the z-direction, incremented in the x-direction by the desired resolution level (i.e. of the order of nanometers) and lowered to the conductive pattern. A processor may automatically perform the following hill-climbing algorithm to achieve alignment:

a) achieve micrometer alignment with positioning stage so that nanotube alignment pattern is within electrode pattern 710, b) check Vout/Vin (FIG. 7*b*) against a predetermined calibration value (Q) set based upon the expected value corresponding to all of the nanotubes in the alignment pattern being in contact with the electrode pattern, if Vout/Vin≧(1+T)*Q repeat a) and generate a flag, if Vout/Vin≧(1+tolerance)*Q twice in a row generate an alarm for a user or operator, (note: the variable T as used above is a user defined tolerance)

c) store the value of Vout/Vin from step b) in memory as value M, d) perform "hopping" (retraction in z-axis, advancement in x-axis according to x-axis resolution, lowering in z-axis), e) check if Vout/Vin≧M, if so replace M with Vout/Vin in the memory and repeat d), if not (and this is the first time this step has been executed) reverse scan direction and "hop" twice the standard x-axis advancement and recheck if Vout/Vin>value stored in the memory, if so store new Vout/Vin in the memory, if not generate a flag and return to step a) and generate an alarm if this occurs on a second pass, f) repeat d) and e) until Vout/Vin (new)<Vout/Vin (old) and then "hop" back to the maximum Vout/Vin position found for the x-axis, g) repeat d)-f) with respect to y-axis direction to find aligned y-axis position.

The above is a simplistic example of a hill-climbing algorithm and other more efficient hill-climbing or similar algorithms may easily be substituted by one of ordinary skill in the art. Scanning probe microscopy is replete with scanning methodologies for efficient scanning and one of ordinary skill in the art is directed to teachings regarding the scanning of AFMs and STMs to guide the methodology of PEBLS alignment sensor scanning.

It is also noted that while a resistance based alignment system is considered as an example other sensor systems such as tunneling detection, atomic or friction force detection, or scanning capacitance measurement may alternatively be used. In the case of tunneling, a small nanometer gap may be maintained between the nanotips and the electrode pattern 710 with a voltage bias maintained between the tips and the electrode pattern 710. Upon aligning with an etched portion of the electrode pattern the tunneling current from the aligned tips would drop off and similar hill-climbing algorithms may be employed for optimizing alignment based on minimizing tunneling current. In the case of atomic or friction force, no initial electrode pattern 710 is necessary on the target substrate but the nanotips must extend beyond layer 1300. Upon approaching a region in which the surface roughness has been changed by an etching or coating process from the lithography nanotips, the sensor nanotips would detect a change in van der Wall or frictional forces. In the case of scanning capacitance, an electrode/dielectric dual layer may be used to form pattern 710 and etching of the dielectric would alter the capacitance between the conductive nanotip and the pattern. A clear analogy exists between the above techniques and the operations of scanning tunneling microscopy, atomic and friction force microscopy, and scanning capacitance microscopy. Any of the various techniques and structures used with the alternate types of scanning probes are applicable to the alignment sensor of the present invention.

V. Fault Tolerance and Redundant Cells

Figure 9:
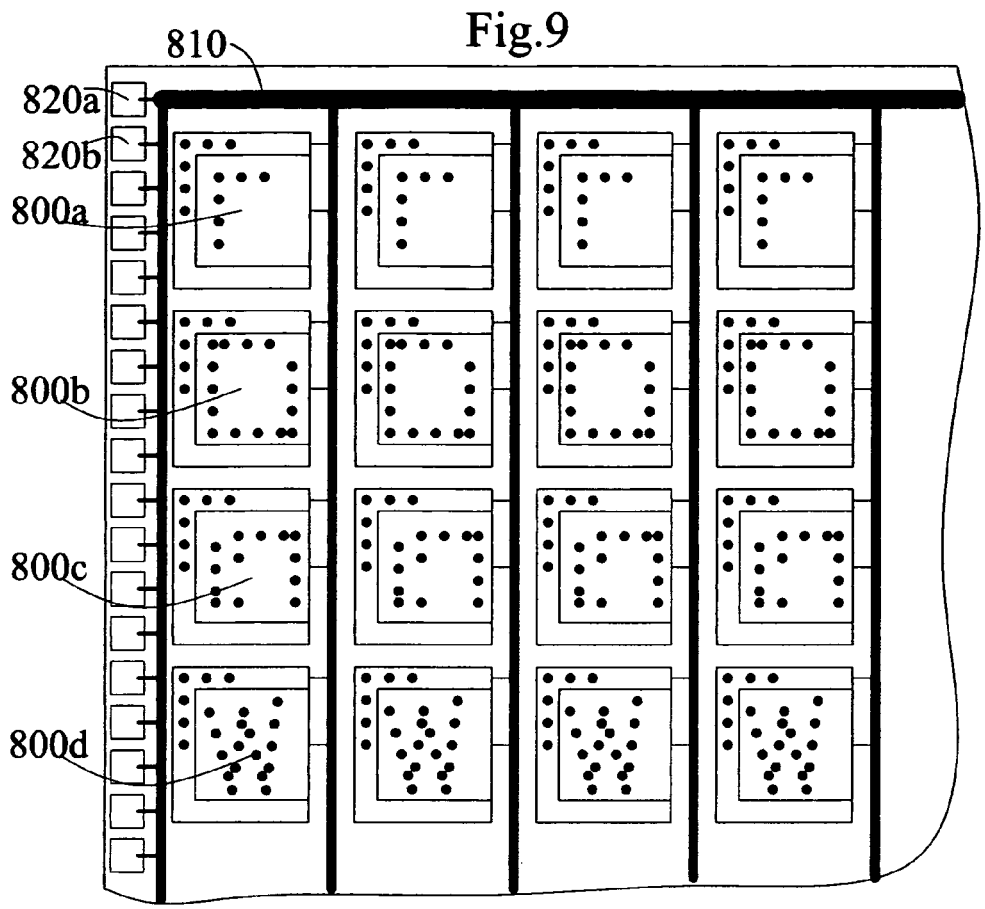
FIG. 9 illustrates an embodiment of the PEBLS tool with redundant nanotip arrays.

FIG. 9 illustrates an extended array of cells for a PEBLS in which each lithographic cell pattern 800*a*-800*d* is duplicated along each row creating a series of redundant cells. Bus 810 supplies independent actuation voltages to the cells applied via contacts 820*a* from a controlling processor (not shown) and transmits signals from the alignment sensors to the controlling processor via contacts 820*b*. In order to compensate for possible failure or misdirection in electron emission from individual nanotips the same lithography pattern is repeated with the multiple redundant cells. In order to maintain consistent processing of a target substrate by the PEBLS the voltage applied during actuation of the nanotips in a single redundant cell is reduced to a time equal to 1/Nth of the amount of actuation time that would be used if no redundant cells were used, where N is the number of redundant cells. For example, if 10 redundant cells were used duplicating a single cell pattern and actuation time would have been 100 ms if no redundant cells were used, the actuation time should be 10 ms for each redundant cell. Thus if a certain percentage of the patterning nanotips are not electron emissive, or otherwise faulty, the error will be diffused by the nanotips which are non-faulty.

If there is a known and expected probability of faulty operation from individual nanotips the actuation time in the case of redundant cell usage may be more properly adjusted based on the individual nanotip fault probability and the number of redundant cells. An individual nanotip raster location on a target substrate may be formed from the overlapping operation of corresponding individual nanotips in each of the redundant cells. The probability of k failures using N redundant cells when the probability of faulty operation from an individual nanotip is p may be expressed as $$P(N,k,p)=N!/[(N-k)!k!]*(1-p)^{N-k}p^k. \quad \text{(Eq1)}$$

If there are zero failures then the duration of voltage supply would simply be $$t_r=t_o/N, \quad \text{(Eq2)}$$

where $t_r$ is the applied duration using the redundant cells and $t_o$ is the duration that would have been applied without any redundant cells. However if k failures are expected then the resultant time $$t_r=t_o/(N-k) \quad \text{(Eq3)}$$

would be the more appropriately applied voltage time since only (N−k) nanotips assigned to a particular raster location would be expected to be operating properly. The optimum voltage duration per redundant cell ($t_r$) may thus be most properly determined as a function of the total number of redundant cells (N) and the probability of individual nanotip failure (p) in terms of a weighted sum of the resultant times (Eq3), wherein the associated failure probabilities (Eq1) are used as the weights as:

$$t_r(N,p)=\Sigma P(N,k,p)t_o/(N-k)(k=0\ldots N) \quad \text{(Eq4)}$$

For example, if 10 redundant cells are used and the individual nanotip fault probability is 10%, then (N=10, p=0.1) and $t_r=0.3487*(t_o/10)+0.3874*(t_o/9)+0.1937*(t_o/8)+0.0574*(t_o/7)+0.0112*(t_o/6)+0.0015*(t_o/5)+0.0001*(t_o/4)+\ldots=0.1126t_o$.

As an alternative (or in complement to) using identical cell patterns for redundancy, they may be used for resolution enhancement. By fabricating extra cells with associated nanotip patterns that are identical in arrangement to a particular pattern, but shifted to different degrees with respect to an associated alignment sensor at displacements less than the interspacing distance between nanotips, resolutions below the nanotip interspacing may be achieved. For example, if an inter-tip spacing of 100 nm in the x-axis is employed for a lithography tip pattern, shifting the relative x-axis displacements between multiple duplicates of the lithography tip pattern and corresponding alignment tips by increments of 10 nm would allow an optimum resolution improvement from 100 nm to 10 nm in the x-axis.

Figure 10:
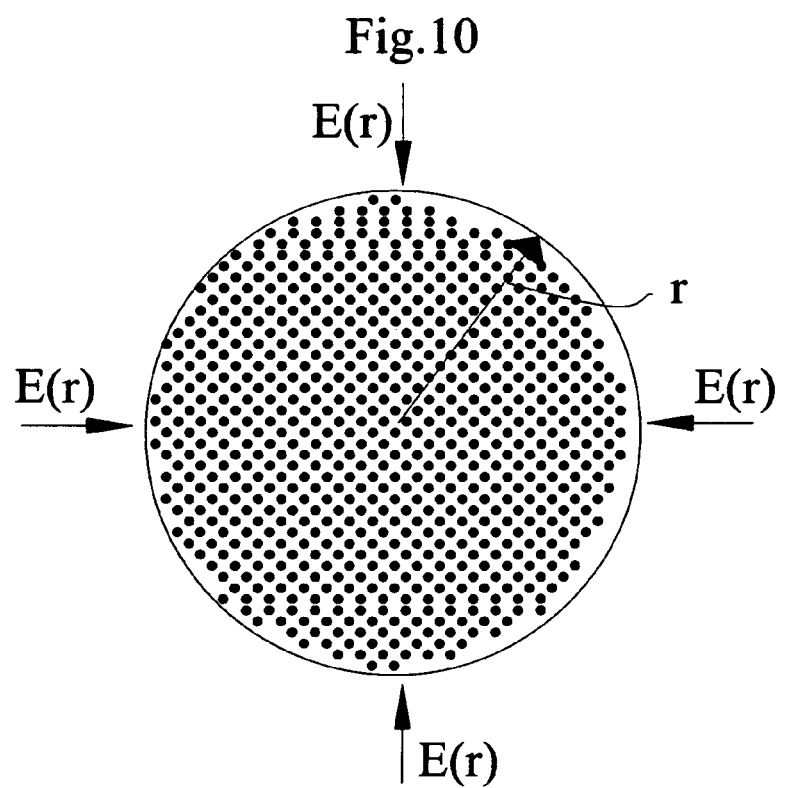
FIG. 10 illustrates the radial electric field generated from electron emission from a high density nanotip array.

One particular source of fault in a PEBLS is undesired charge build up. FIG. 10 illustrates a radial electric field produced by electron charge buildup from a completely filled electron-emitting nanotip array. As negative charges build up within the area between the emission tips and target substrate due to secondary or backscattered electrons the intended impact location of emitted electrons will be altered. The relationship between field emission current from an individual conductive tip and applied voltage, as described by the Fowler-Nordheim model, is $$I=aV^2\exp[-(b\phi^{3/2})/(\beta V)] \quad \text{(Eq5)}$$

where I is the emitted current, V is the applied voltage, β is the field enhancement factor dependent on tip geometry, φ is the work function of the tip; and a and b are constants.

Using data from Suh et al. "Study of the field-screening effect of highly ordered carbon nanotube arrays" (Applied Physics Letters, Volume 80, No. 13, 2002, 2392-2394) an applied field of 5.3 V/μm produces an emission current density of 40 μA/cm² with a uniform nanotube density of the order of $10^{10}$ tubes/cm². Assuming each nanotube has an identical diameter and height, the current produced per tube is 40 μA/$10^{10}$ tubes=4×$10^{-15}$ A. Given the elementary charge of an electron this equates to 4×$10^{-15}$ A/1.6×$10^{-19}$ C=25,000 electrons/second produced by the average nanotube tip. Negative charge build up from backscattered electrons from one nanotip produces a radial electric field according to $$E_{r1}=(\eta e\Sigma t)/(2\pi\in rz) \quad \text{(Eq6)}$$

where $E_{r1}$ is the radial electric field for one nanotip, η is the number of electrons emitted per second by the nanotip, Σ is the ratio of backscattered or secondary electrons produced to the number of incident electrons, e is the electron charge, t is the duration of emission, E is the permittivity of the media between the nanotip and the target substrate, r is the radial distance from the tip along the plane of the target substrate, and z is the distance between the nanotip and the target substrate (i.e. the depth of the cell).

For a uniform nanotip density p (nanotips/cm²) enclosed in a radius r, the radial field is $$E(r)=E_{r1}\rho\pi r^2=(\rho r\eta e\Sigma t)/(2\in z)=Jr\Sigma t/(2\in z) \quad \text{(Eq7)}$$

where J=ρ ηe is the current density of the emission current. The deviation (Δ) of the actual electron motion (where $m_e$ is the electron mass) from the intended motion is thus given by $$\delta=(e/2m_e)E(r)t^2=(eJr\Sigma t^3)/(4m_e\in z). \quad \text{(Eq8)}$$

From the above equation the deviation (δ) is at a maximum value for the tips located at the outer edges of the cell. For larger cell sizes the deviation may be reduced by lowering the current density J (by reducing the applied voltage), reducing the emission duration t, or increasing the designed spacing Δz between the emission tips and the target substrate. Lower energy fabrication procedures corresponding to a low current density or low actuation time would allow for larger cell sizes to be effective. One methodology that may be used to allow for larger cell sizes without disruptive charge accumulation is to perform periodic decharging during a fabrication duration. For example, if a particular etch pattern requires a 100 ms duration of electron bombardment, but charge buildup for a time greater than 25 ms at the required energy level would results in an intolerable deviation value, the duration may be reduced to 25 ms and repeated 4 times with a decharge step performed between each 25 ms interval using a decharging mechanism such as that described in section VII.

VI. Independent Cell Position Control

Figure 11:
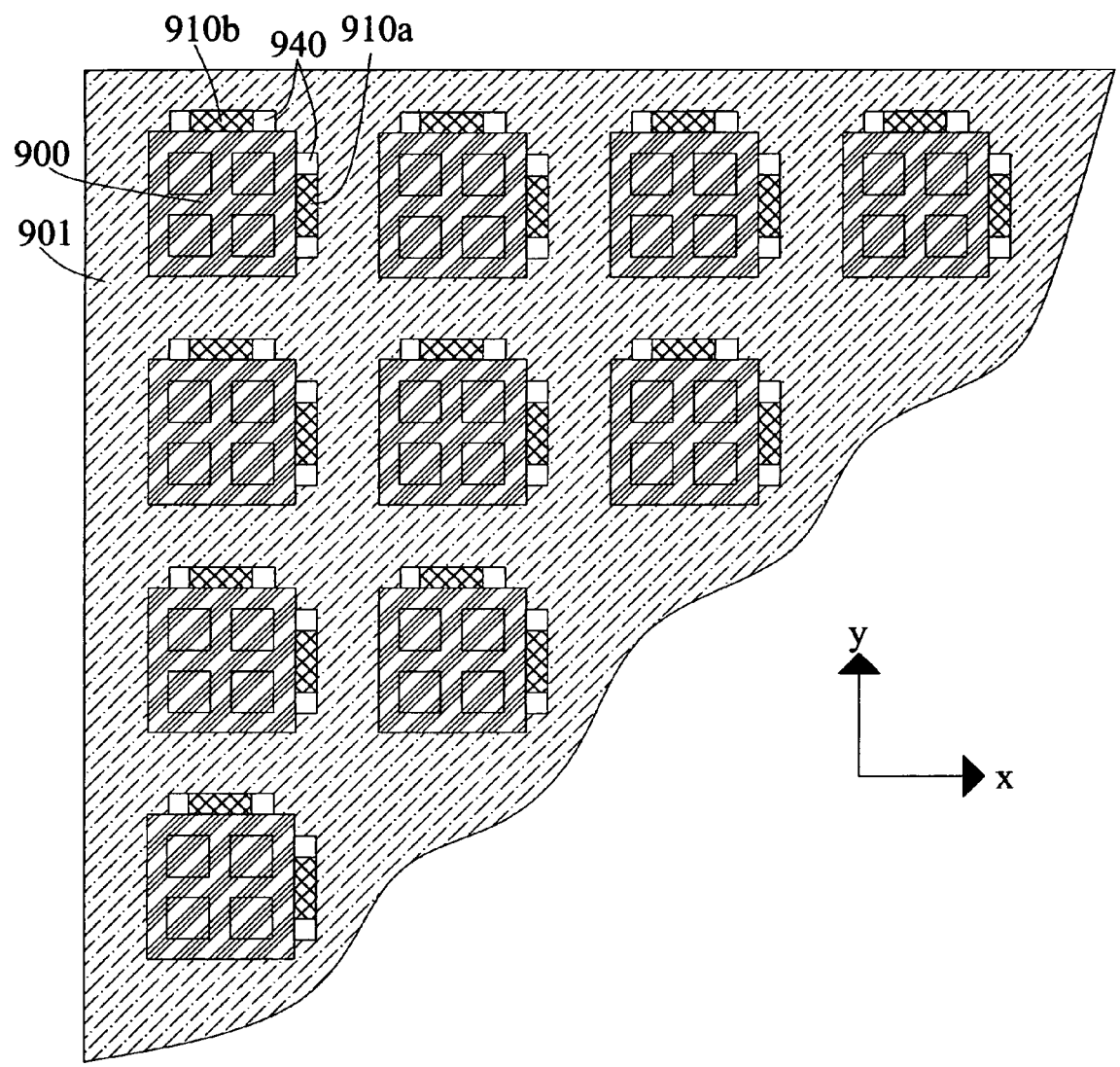
FIG. 11 illustrates positioning mechanisms for an array of PEBLS.

In order to process multiple different portions of a target substrate simultaneously multiple PEBLS may be used together. FIG. 11 shows a section of a substrate 901 including plural PEBLS 900 formed in an array. Separate piezoelectric actuators 920b and 920c (side view of FIG. 12) or 910a and 910b (top view of FIG. 11) are provided associated with each PEBLS 900 for fine X, Y, and Z positioning. Substrate 901 may be the same substrate out of which the PEBLS substrate 1000 is formed or, in the alternative, each PEBLS may be modularly formed so as to be removable and replaceable in case individual PEBLS are damaged or desired to be upgraded or changed to a different PEBLS type.

Gaps 940 may be etched into substrate 901 during fabrication to provide spaces for piezoelectric actuators and electrical interconnects. As an alternative, microelectromechanical actuators such as electrostatic combtooth drives or any other integrated mems actuator may be formed along with the interconnection and electrical wiring on the substrate 901 so as to provide the positioning. Shinjo et al. U.S. Pat. No. 5,412,641 uses similar actuation systems to position arrays of STMs in an information recording apparatus. One of ordinary skill in the art may look to scanning probe microscopy (AFM, STM) positioning mechanisms for other alternative positioning mechanisms to achieve nanometer positioning regulation.

Figure 12:
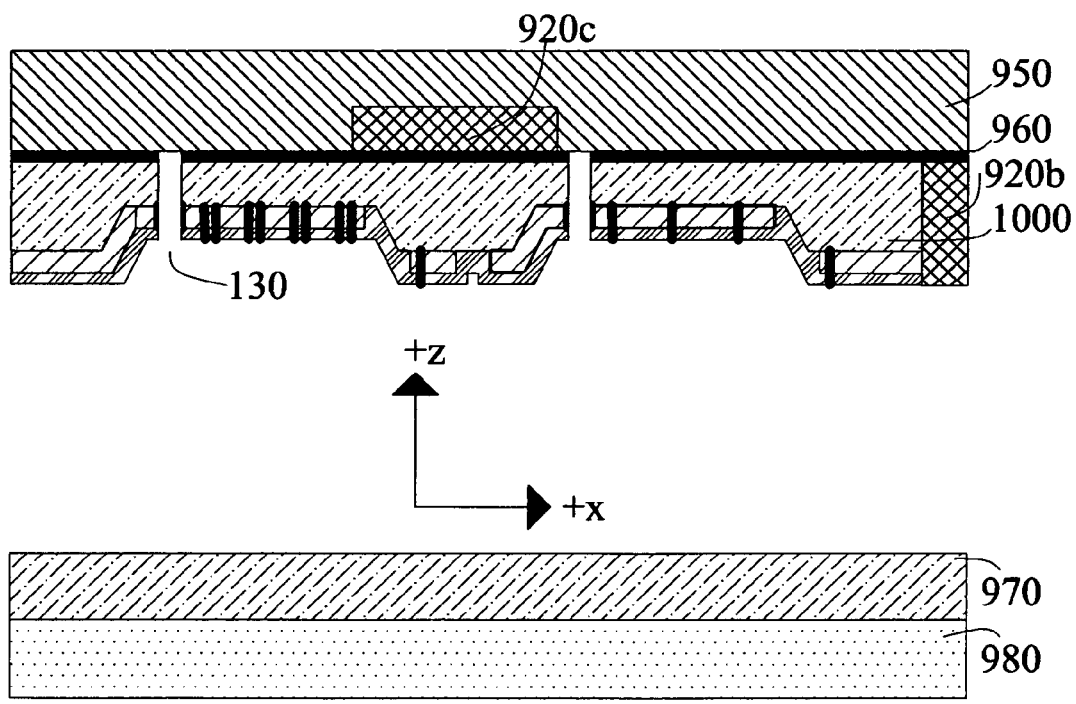
FIG. 12 illustrates a PEBLS opposed to a target substrate that is undergoing a fabrication process.

FIG. 12 shows a cross-section of an individual PEBLS connected to a fluid supply system 950. Piezoelectric actuator 920c may be placed between the fluid supply system 950 and PEBLS such that it is centrally located in the center of mass of the PEBLS for z-axis positioning without tilt with respect to the XY plane. In an alternative embodiment, actuator 920c may be formed to extend across the length and width of the individual PEBLS with apertures formed in the actuator that correspond to the positions of channels 130 so as to allow fluid flow between the channels 130 and the fluid supply system 950 through the actuator 920c. An adhesive layer 960 may be provided between the PEBLS and the fluid supply system 950/actuator 920c. The material and thickness of the adhesive layer should be appropriately chosen to minimize play between the actuator 920c and PEBLS while taking into account thermal stress which may occur because of different coefficients of thermal expansion for the fluid supply system 950 and the PEBLS substrate 1000. One of ordinary skill in the art is advised to look to the semiconductor industry for teachings in this regard and to look to the inkjet printing and microfluidic industry for teachings related to fluid interconnects and compatible adhesives used therewith.

FIG. 12 shows substrate 970 which is the target of fabrication for the PEBLS. XYZ stage 980 is used for course positioning of the substrate 970 so as to move the target area of the substrate so as to be opposed to different cells during different fabrication steps. For example, if cell sizes are 1 cm×1 cm and the spacing between adjacent cells is 0.1 cm in the x and y directions then a) the alignment cell (cell 101 in FIG. 1) imprints the alignment pattern on the substrate 970, b) the stage retracts the substrate 970 from the PEBLS and repositions the substrate 1.1 cm to the neighboring cell (cell 102 in FIG. 1), c) fine positioning of the PEBLS is performed using actuators 920a-920c which are set to be electrically responsive to the alignment sensors 120 via a microprocessor control system and which undergo hillclimbing or similar algorithmic processes to find the optimum alignment position as described previously, d) once the optimum alignment position is found electrode 102a of cell 102 is actuated forming the desired pattern on substrate 970 (via curing a resist, performing localized electrochemical reactions, or other operation modes), e) steps b-d are repeated to imprint the pattern of cell 103 and again repeated for cell 104.

For larger N×M cell arrays the above process may proceed with left to right (+x direction) scanning so as to cover cells oriented in the x-direction and imprint one row of cell patterns. Then by shifting down to an adjacent row the next row of cell patterns may be imprinted by a right to left (negative x direction) scan. This process may be repeated for all the rows of cells desired to be imprinted. However, if a specifically desired process calls for using only a preset number of cells in a specific pattern, a special scanning algorithm may be created for the control microprocessor so that only desired cells are used in a predetermined order. It is noted that the operation of the PEBLS in this manner is somewhat analogous to the operation of a typewriter in which each cell imprint pattern is analogous to a letter.

VII. Gate Control and Decharging Mechanism

Figure 13:
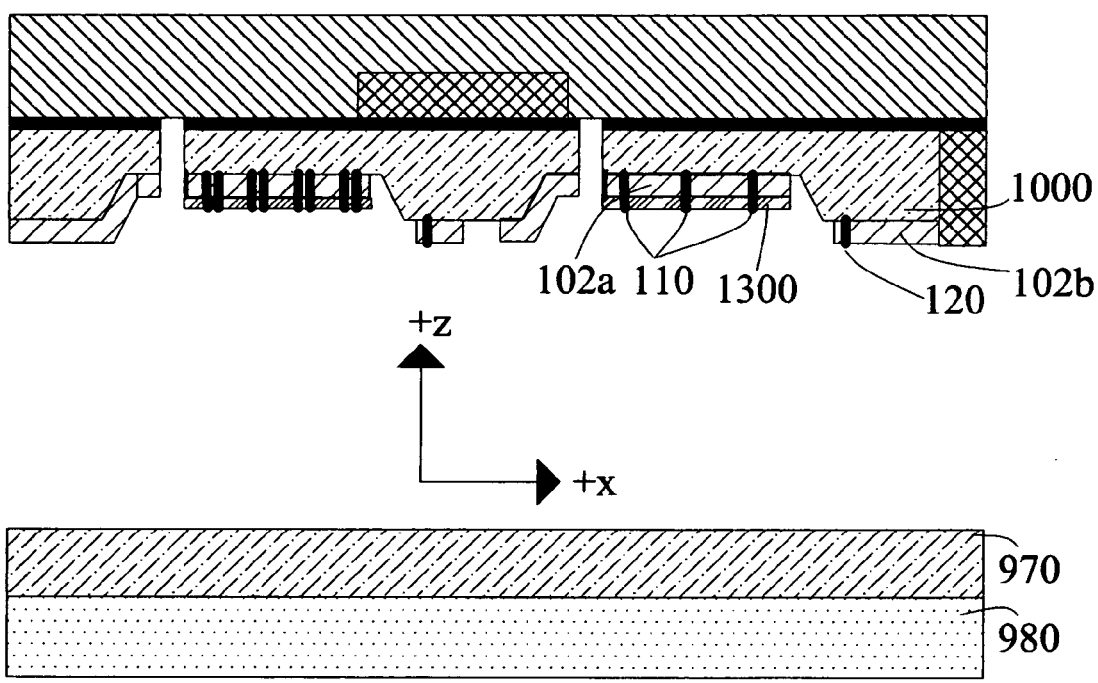
FIG. 13 shows an alternative embodiment of the PEBLS structure in which a passivation film is formed only around the lithographic nanotips and not over the reference sensing nanotips.

FIG. 13 shows an alternative embodiment of the PEBLS structure in which passivation film 1300 is formed only around the lithographic nanotips 110 and not over the reference sensing nanotips 120. In this embodiment the target substrate 970 is used as an anode and the actuation electrode 102a as the cathode while electrode 102b is used as a gate electrode to regulate the current generated from the lithographic nanotips 110. If the target substrate 970 is conductive or semiconductive then contact between electrode 102b and substrate 970 may be used to positively bias the substrate 970 and modulation of the current density produced by the nanotips may be achieved based upon the voltage applied to electrode 102b. Electrode 102b may also be used to remove residual negative charges between process steps.

VIII. Operation Methods

1. Forming a Larger PEBLS Nanotip Array from a Smaller PEBLS Nanotip Array.

Figure 14:
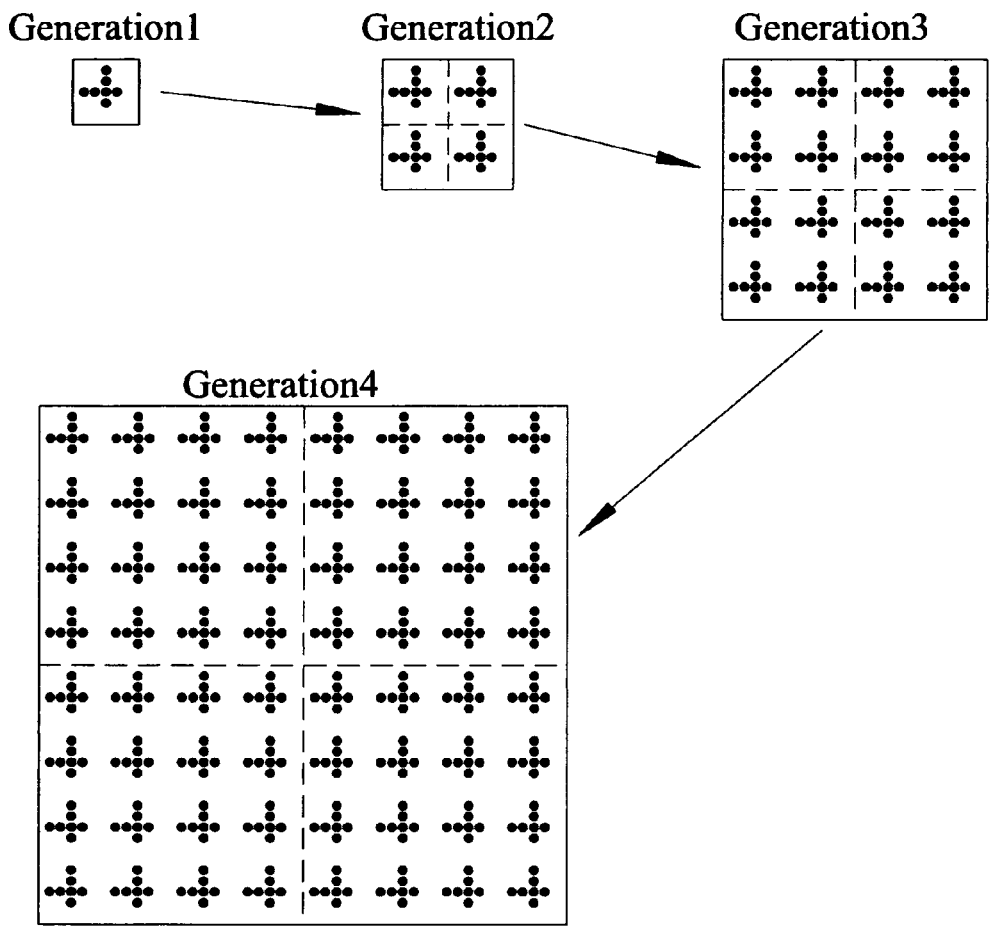
FIGS. 14 and 15 illustrates use of a PEBLS to generate larger PEBLS patterns.

Using an initial small array of electron emitting nanotips arranged in a predetermined pattern, larger arrays of electron emitting nanotips repeating the predetermined pattern may be created. This may be useful when a lithography pattern corresponding to a particular structure, such as an individual transistor's gate connection, is desired to be repeated several times during a fabrication procedure at various locations. The placement of catalytic particles used to form a nanotip may be determined by electron beam etching of a thin film e-beam resist over which a thin film containing catalytic nanoparticles such as Co or Ni are then placed and the resist removed leaving catalytic particles in locations corresponding to the electron etch. A small array of electron emitting nanotips corresponding to a basic predetermined pattern (Generation1, FIG. 14) may be repeatedly used to etch an e-beam resist so as to determine placement of a pattern of catalytic nanoparticles to be used for fabrication of a nanotip array pattern corresponding to Generation2 as illustrated in FIG. 14. Larger repeated nanotip patterns may be fabricated by using the directly preceding generation (i.e. Generation 3 may be fabricated using Generation 2, etc.) As one example of the potential of this approach starting with a first generation nanotip pattern of 100 nanotips, a nanotip array of $10^{10}$ nanotips may be created using 100 fabrication steps per generation over four generations ($100 \Rightarrow 10{,}000 \Rightarrow 1{,}000{,}000 \Rightarrow 10^8 \Rightarrow 10^{10}$).

Figure 15:
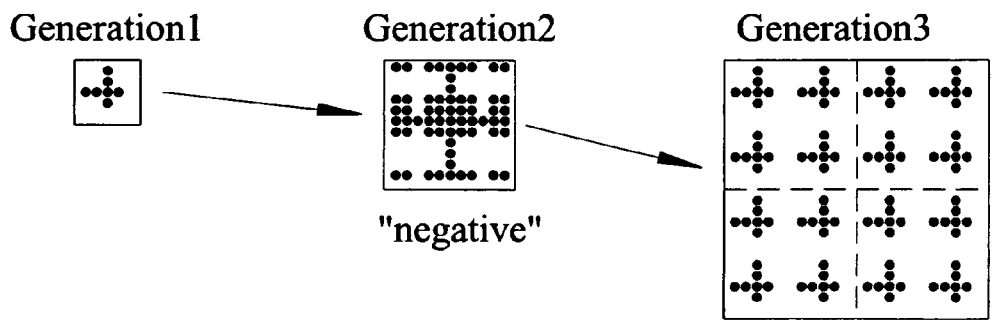

Instead of using duplication of a single nanotip basic pattern, multiple different basic nanotip patterns may be combined to form more complex arrays. Also, instead of using the electron beams from a basic nanotip electron beam pattern to determine placement of catalytic particles for larger generation array fabrication, the electron beams from a basic nanotip pattern may be used to perform etch removal of opposing nanotips. Employing this particular methodology to create larger nanotip arrays would result in a "negative" of the basic nanotip pattern being created in the second generation (see FIG. 15). However, repeating the process to create a third generation would result in a positive nanotip pattern.

Using this approach, large and complex arrays of lithographic nanotip patterns may be formed from smaller, more basic nanotip array patterns in a reasonable amount of steps.

2. Electrostatic Assisted Patterning Using PEBLS.

The nanotips of the PEBLS may be used to establish an electrostatic pattern on an insulating substrate or thin film layer in accordance with the patterned arrangement of the nanotips. The fluid supply system of the PEBLS may then be used to supply a concentration of molecules or small particles within the cavity of the PEBLS which may be attracted to the charged regions. Similar electrostatically driven nanofabrication techniques have been disclosed by Darty U.S. Pat. No. 6,899,854 and Deppert et al. U.S. Patent Application Publication 2003/0102444 and demonstrated by Mirkin et al. "Electrostatically Driven Dip-Pen Nanolithography of Conducting Polymers" (Adv. Mater., 2002, 14, No. 20) and Mesquida et al. "Maskless nanofabrication using the electrostatic attachment of gold particles to electrically patterned surfaces" (Microelectronic Engineering 61-62, 2002, 671-674). In the case that a continuous molecular flow or a continuous flow of nanoparticle containing fluid is used in this type of fabrication procedure both a fluid entry channel and a separate fluid exit channel may be provided for the PEBLS.

3. Curing e-Beam Resists or Direct Etching Using PEBLS.

Conventional e-beam lithography may employ one of several possible negative or positive resists including COP, GeSe, PBS, or PMMA. These resists may also be used on a substrate to be processed by a PEBLS. Apart from the electron exposure step the same steps of conventional electron lithography may be employed to initially coat the resist (such as by spin coating), remove the exposed or unexposed resist patterns (depending on whether positive or negative resist is used), etc. However, the ability to locally supply or remove material via the fluidic channels provided in the PEBLS may help facilitate steps of the fabrication procedure.

Etching may also be achieved by the PEBLS. Etching by tunneling electrons and conventional electrons emitted from tips in proximity to a substrate are discussed in Li et al. U.S. Pat. No. 4,896,044 and Hodgson et al. U.S. Pat. No. 5,047,649. The same principles should apply to etching from a PEBLS with the improvement that PEBLS fabrication is a parallel rather than a serial process.

4. Electrochemical Surface Reactions Using PEBLS.

Electrochemical lithographic processing may also be carried out by either coating the substrate to be processed with a electron sensitive film or properly controlling the atmosphere within the cavity of the PEBLS so as to contain a particular concentration of electron sensitive vapor. Bard et al. U.S. Pat. No. 4,968,390 provides an example of a scanning electrochemical tip used in this fashion.

5. Other Methodologies.

As the above examples demonstrate several different manufacturing methodologies may be employed in combination with a PEBLS and one of ordinary skill in the art may look to PEBLS as a way to introduce improved production rates to a variety of scanning probe lithography techniques or conventional electron lithography techniques.

IX. Conclusion

As described in the previous sections many modifications of the present invention are possible and many applications within lithographic processing are foreseeable. However, the present invention is only limited by the following claims.

I claim:

1. A Parallel Electron Beam Lithography Stamp (PEBLS) apparatus comprising:
   a substrate with a first side and a second side;
   an array of lithographic nanotips capable of electron emission formed substantially normal to the first side of the substrate;
   target to be lithographically patterned by the array of lithographic nanotips; and
   an array of sensing nanotips formed substantially normal to the first side of the substrate and provided on at least two sides of the lithographic nanotips so as to provide an alignment reference for the lithographic nanotips,
   wherein the array of lithographic nanotips is formed in a pattern corresponding to a desired lithographic pattern on the target to be processed and wherein the apparatus is constructed to allow at least a portion of the first side of the substrate to contact the target during lithography.

2. The apparatus of claim 1, wherein the lithographic nanotips are carbon nanotubes.

3. The apparatus of claim 1, further comprising a protection layer for the array of lithographic nanotips.

4. The apparatus of claim 1, further comprising:
   a single actuation electrode associated with the array of lithographic nanotips so that actuation of the actuation electrode provides electron emission from the lithographic nanotip array.

5. The apparatus of claim 1, further comprising:
   a cell formed on the first side of the substrate that forms an enclosing space around the lithographic nanotips.

6. The apparatus of claim 5, further comprising:
   an aperture formed through the substrate so as to allow fluid communication from the second side of the substrate to the enclosing space formed by the cell.

7. The apparatus of claim 1, further comprising:
   a first cell formed on the first side of the substrate that forms an enclosing space around the lithographic nanotips; and
   a second cell formed on the first side of the substrate that forms an enclosing space around another array of lithographic nanotips.

8. The apparatus of claim 1, further comprising:
   a positioning mechanism to provide alignment between the lithographic nanotips and the target to be processed.

9. A method of lithography comprising:
   providing the apparatus of claim 1;
   using the apparatus to perform at least one lithographic process step.

10. A method of lithography of claim 9, wherein the at least one lithographic process step includes forming an electrostatic pattern on the target in accordance with the pattern of lithographic nanotips.

11. A method of lithography of claim 9, wherein the at least one lithographic process step includes curing an e-beam resist of the target in accordance with the pattern of lithographic nanotips.

12. A method of lithography of claim 9, wherein the at least one lithographic process step includes etching a pattern on the target in accordance with the pattern of lithographic nanotips.

13. A method of lithography of claim 9, wherein the at least one lithographic process step includes initiating electrochemical reactions on the target in accordance with the pattern of lithographic nanotips.

14. A method of lithography of claim 9, wherein the at least one lithographic process step is used in manufacturing another PEBLS.

15. A method of lithography of claim 9, wherein during the at least one lithographic process step the lithography nanotips are in direct contact with the target.

16. A method of lithography of claim 9, wherein during the at least one lithographic process step the lithography nanotips are spaced apart from the target.

17. A method of lithography of claim 9, wherein during the at least one lithographic process step is used in the fabrication of an electronic circuit or electronic component.

18. A Parallel Electron Beam Lithography Stamp (PEBLS) comprising:
- a substrate with a first side and a second side in which at least one cell forming an enclosing space is formed on the first side;
- an actuation electrode formed at the bottom of the cell;
- a sensing electrode formed around the periphery of the cell;
- an array of lithographic nanotips capable of electron emission formed extending from the actuation electrode substantially normal to the plane of the substrate over which they are formed;
- an array of sensing nanotips formed extending from the sensing electrode substantially normal to the plane of the substrate over which they are formed;
- an aperture formed through the substrate so as to allow fluid communication from the second side of the substrate to the enclosing space formed by the cell.

19. A Parallel Electron Beam Lithography Stamp (PEBLS) comprising:
- a substrate with a first side and a second side;
- an array of lithographic nanotips capable of electron emission formed substantially normal to the first side of the substrate;
- a cell formed on the first side of the substrate that forms an enclosing space around the lithographic nanotips; and
- an aperture formed through the substrate so as to allow fluid communication from the second side of the substrate to the enclosing space formed by the cell.

* * * * *